(12) United States Patent
Huang et al.

(10) Patent No.: US 12,169,773 B2
(45) Date of Patent: Dec. 17, 2024

(54) OPTOELECTRONIC SYNAPTIC MEMRISTOR

(71) Applicant: BEIHANG UNIVERSITY, Beijing (CN)

(72) Inventors: Anping Huang, Beijing (CN); Yuhang Ji, Beijing (CN); Qin Gao, Beijing (CN); Mei Wang, Beijing (CN); Zhisong Xiao, Beijing (CN)

(73) Assignee: BEIHANG UNIVERSITY, BeiJing (CN)

( * ) Notice: Subject to any disclaimer, the term of this patent is extended or adjusted under 35 U.S.C. 154(b) by 598 days.

(21) Appl. No.: 17/480,391

(22) Filed: Sep. 21, 2021

(65) Prior Publication Data
US 2022/0036170 A1 Feb. 3, 2022

(30) Foreign Application Priority Data
Aug. 4, 2021 (CN) .......................... 202110891073.4

(51) Int. Cl.
*G06N 3/067* (2006.01)
*H01L 29/06* (2006.01)
*H01L 31/0352* (2006.01)

(52) U.S. Cl.
CPC ....... *G06N 3/0675* (2013.01); *H01L 29/0673* (2013.01); *H01L 31/035218* (2013.01); *H01L 31/035227* (2013.01)

(58) Field of Classification Search
CPC ...... G06N 3/0675; G06N 3/088; G06N 3/049; H01L 29/0673; H01L 31/035218;
(Continued)

(56) References Cited

U.S. PATENT DOCUMENTS 10,910,559 B2 * 2/2021 Defferriere ........... G11C 13/048
11,320,588 B1 * 5/2022 Mazed .................. G16H 10/40
(Continued)

OTHER PUBLICATIONS

Wang et. al. (2016). Memristors with diffusive dynamics as synaptic emulators for neuromorphic computing. Nature Materials. 16.10. 1038/nmat4756. (Year: 2016).*
(Continued)

*Primary Examiner* — Sitaramarao S Yechuri

(57) ABSTRACT

An optoelectronic synaptic memristor includes: a bottom electrode layer, a porous structure layer modified with quantum dots, a two-dimensional material layer, a transparent top electrode layer, and a waveguide layer, which are arranged in sequence from top to bottom, wherein the waveguide is ridge shaped for light conduction, comprising a wedge-shaped output terminal, wherein: through the wedge-shaped output terminal of the waveguide, light is vertically injected into the two-dimensional material layer and the porous structure layer modified with the quantum dots. By integrating the waveguide and the optoelectronic memristor, the present invention obtains the highly controlled characteristics with high alignment and confinement for light effect on the device and has advantages in realizing optoelectronic synergy in the optoelectronic synaptic memristors. The present invention has strong controllability and excellent performance and can be widely used in high-density integration of storage and computing, artificial synapses, artificial intelligence, etc.

6 Claims, 6 Drawing Sheets

(58) Field of Classification Search
CPC ... H01L 31/035227; H10B 63/80; H10N 70/24; H10N 70/257
See application file for complete search history.

(56) References Cited

U.S. PATENT DOCUMENTS

| | | | | |
|---|---|---|---|---|
| 2008/0090337 | A1* | 4/2008 | Williams | H10N 70/883 |
| | | | | 257/E45.002 |
| 2009/0133741 | A1* | 5/2009 | Higuchi | H01G 9/2068 |
| | | | | 438/73 |
| 2009/0293947 | A1* | 12/2009 | Higuchi | H01G 9/2068 |
| | | | | 438/69 |
| 2010/0119192 | A1* | 5/2010 | Fujikata | G02B 6/4204 |
| | | | | 257/E31.127 |
| 2010/0278479 | A1* | 11/2010 | Bratkovski | G02B 6/12007 |
| | | | | 359/315 |
| 2017/0018688 | A1* | 1/2017 | Mazed | H01L 27/14621 |
| 2018/0113330 | A1* | 4/2018 | Maguire-Boyle | G02F 1/091 |
| 2020/0183085 | A1* | 6/2020 | Mentovich | G02B 6/1223 |

OTHER PUBLICATIONS

Jo et al. "Nanoscale Memristor Device as Synapse in Neuromorphic Systems" Nano Letters 2010 10 (4), 1297-1301 DOI: 10.1021/nl904092h (Year: 2010).*

* cited by examiner

OPTOELECTRONIC SYNAPTIC MEMRISTOR

CROSS REFERENCE OF RELATED APPLICATION

The application claims priority under 35 U.S.C. 119(a-d) to CN 202110891073.4, filed Aug. 4, 2021.

BACKGROUND OF THE PRESENT INVENTION

Field of Invention

The present invention relates to an optoelectronic synaptic memristor, which provides accurate regulation of optoelectric signals, low energy consumption, synapse simulation, and accelerated neuromorphic computing, belonging to a technical field of the brain-like computing device.

Description of Related Arts

With the development of novel theories and technologies such as big data, cloud computing, quantum information, and neuromorphic computing, artificial intelligence has become the core driving force leading a new round of technological revolution and industrial transformation, and is considered to be one of the three major technological changes in the next decade which is the first to appear. Due to the explosive growth of information, the conventional "von Neumann" system with separated computing and storage can no longer meet the development needs of the novel technologies such as artificial intelligence, the Internet of things, and autonomous driving in terms of power consumption and speed, and is not capable of real-time and self-adaptive evolution to satisfy the changing application scenarios and demands, making it difficult to realize intelligent data and information processing. Conventionally, it is generally believed that the faster and more intelligent ways are mainly: neuromorphic computing and quantum computing. Among them, the neuromorphic computing inspired by low power consumption and high parallel processing of human brains is considered to be the most promising solution to the "storage wall" and self-adapting problems.

An important prerequisite for realizing neuromorphic computing is the development of devices that can simulate biological synaptic behavior. Conventionally, neuromorphic computing mainly includes CMOS-based devices and neuromorphic devices. The latter begins to simulate basic biological information processing units, namely neurons and synapses, at the underlying component level, which has significant advantages in terms of power consumption, fault tolerance, and reconfigurability. In particular, photon-involved neuromorphic devices, which are introduced in recent years, have become a research hotspot in the field of bio-inspired synaptic devices, bringing new opportunities for the development of synaptic devices. Among many types of synaptic devices, the memristor (M) has become the most concerned hardware unit among the synaptic devices due to its simple structure, high integration, non-volatility, and compatibility. Therefore, the research and development of optoelectronic synaptic devices that can be used to realize neuromorphic computing, the exploration of synaptic behavior and response mechanisms, and the design of integrated circuits based on optoelectronic synaptic devices are of great significance for promoting neuromorphic computing and brain-like cognition, and accelerating the development of a new generation of artificial intelligence.

Although significant progress has been made in the investigation of optoelectronic synaptic devices and their performance regulation and mechanism, there are still many scientific problems and technical difficulties, and many challenges are still standing ahead in the aspects of devices, models, and architectures. From the aspect of devices, the integrated design of materials, mechanisms, and optoelectronic devices is required. The neurons and synapses in conventional optoelectronic synaptic devices have not yet simulated and described the synergistic functions of the blocks in biological neural networks, especially in terms of architecture, performance, and optoelectronic synergy. From the aspect of architecture, although two-terminal devices are conducive to high-density array integration than three-terminal units, they are likely to cause problems such as signal crosstalk. Therefore, there are still difficulties in realizing photonic synaptic array integration. From the aspect of performance, it is easier to induce excitatory postsynaptic current (EPSC) with photogenerated carriers, while it is more difficult to generate inhibitory postsynaptic current (IPSC) with light. More breakthroughs are still needed in negative light response, photothermal/optoelectronic conversion, and surface analysis of light-induced materials. From the aspect of optoelectronic synergy, although optoelectronic synaptic devices have significant performance advantages such as power consumption, the light import/export method needs to be further studied.

SUMMARY OF THE PRESENT INVENTION

Given the problems of the conventional optoelectronic synaptic memristor, the present invention combines optoelectronic memristive functions of two-dimensional materials and light guiding functions of porous materials, to provide an optoelectronic synaptic memristor according to principles thereof. The present invention provides a new path for the exploration of optoelectronic synergetic mechanisms, which can improve the performance of optoelectronic synaptic memristors, and can be used to simulate artificial synapses and accelerate neuromorphic calculations, thereby providing a great application prospect in brain-like application fields.

The difficulty of the present invention is to design a memristor structure comprising a ridge waveguide, a transparent top electrode layer, a two-dimensional material optoelectronic memristive layer, light conversion and conduction layer with quantum dots modified porous structure, and a substrate used as a bottom electrode. The waveguide, the optoelectronic memristive layer, and up-conversion light emitters are combined. Lights of different wavelengths and intensities are transmitted in the optical waveguide. Conversion light emitter controls the optoelectronic memristive layer. As a result, precise control and inhibitive light effect of optoelectronic memristive properties can be realized, and synergy effect can be enhanced. The integrated architecture of the waveguide and optoelectronic synaptic memristor is designed to integrate and control optoelectronic signals. The present invention adopts conventional fabrication methods, having the feasibility of large-scale preparation. The present invention uses a novel device structure and integrated optoelectronic architecture to solve the problems of the optoelectronic synaptic device in the realization of the negative light effect, precise regulation of the optoelectronic signals, realization, and enhancement of the optoelectronic synergy, integration of the optoelectronic signals, etc.

The present invention adopts technical solutions as follows.

An optoelectronic synaptic memristor comprises a bottom electrode layer, a porous structure layer modified with quantum dots, a two-dimensional material layer, a transparent top electrode layer, and an optical waveguide layer, which are arranged in sequence from top to bottom, wherein: a bottom of the two-dimensional material layer is attached on the porous structure layer modified with the quantum dots; and a top of the two-dimensional material layer is connected to the transparent top electrode layer.

The waveguide layer is a ridge waveguide for light conduction, comprising a wedge-shaped output terminal, wherein: through the wedge-shaped output terminal at the waveguide end, light is vertically injected into the two-dimensional material layer and the porous structure layer modified with the quantum dots. A size design of the waveguide layer should fully consider actual material and integration conditions and select appropriate values, to reduce an optical loss as far as possible and achieve an optimal reflection effect.

The ridge waveguide is made of gallium nitride (GaN), silicon nitride ($Si_3N_4$), aluminum nitride (AlN), silicon carbide (SiC), silicon (Si), or silicon oxide ($SiO_2$).

The wedge-shaped output terminal has four inclined walls for reflecting light conducted inside, wherein an inclination angle of each wall is 30-60°.

The optoelectronic synaptic memristor further comprises an oxide isolation layer which is arranged between the two-dimensional material layer and the optical waveguide layer, wherein: a refractive index of the oxide isolation layer is less than that of the optical waveguide layer; a hole, whose shape is consistent with the transparent top electrode layer, is provided on the oxide isolation layer, for placing the transparent top electrode layer.

The porous structure layer modified with the quantum dots serves as an up-conversion light emitter and light channel, wherein: the quantum dots serve as an up-conversion center and are attached in the porous structure layer; the porous structure layer is a vertical porous array and can remit incident light of the transparent top electrode layer into the two-dimensional material layer after up-conversion.

The quantum dots are made of materials having an up-conversion function, wherein the material is one of cadmium telluride (CdTe), cadmium selenide (CdSe), indium phosphide (InP), zine sulfide (ZnS), cadmium sulfide (CdS), graphene, graphene oxide, reduced graphene oxide, and $NaYF^4$.

The porous structure layer is a porous array that is vertically arranged and made of silicon oxide ($SiO_2$), silicon (Si), aluminum oxide ($Al_2O_3$), copper oxide (CuO), nickel oxide (NiO), titanium dioxide ($TiO_2$), or tungsten trioxide ($WO_3$).

The two-dimensional material layer is a monolayer, multilayer, or heterogeneous structure selected from a group consisting of molybdenum disulfide ($MoS_2$), molybdenum oxide ($MoO_x$), molybdenum sulfide oxide ($MoS_xO_{2-x}$), molybdenum selenide (MoSe), molybdenum sulfide selenide (MoSSe), boron nitride (BN), black phosphorus (BP) and graphene.

Under an effect of an electric field, the internal vacancy defect of the two-dimensional material structure layer can migrate and converge therein, and finally form a conductive filament. With the conversion of positive and negative electric fields, conductive filaments are formed and broken, leading to memristive behavior. Under optoelectronic synergy, when an infrared light which is insensitive to the two-dimensional material is injected into the quantum dots in the porous structure, it is converted into a light of a sensitive wavelength of the two-dimensional material due to an up-conversion emitting effect, and then is reversely injected into the two-dimensional material. Due to the optoelectronic effect, a device on-state current is increased and a device resistance state is reduced, while the two-dimensional material, the quantum dots, and the porous structure will not change significantly. When a stronger infrared light is injected on the two-dimensional material and the porous structure modified with the quantum dots, a long wave photothermal effect is enhanced to exceed the optoelectronic effect, causing a negative device photocurrent and increasing the device resistance state.

Based on the positive light/negative light effect and optoelectronic/photothermal conversion mechanism, the EPSC/IPSC dynamic competition relationship of the synaptic device is regulated, and device opening and resetting are realized through excitation/inhibition of the optoelectronic synergy.

The transparent top electrode layer is formed by a metal nanowire network or a film, which has both electrical conductivity and light transmission; the metal nanowire network is a silver (Ag), a gold (Au), a copper (Cu), or a platinum (Pt) nanowire; and the film is an ITO or an FTO film.

The bottom electrode layer comprises a conductor or semiconductor substrate, which is made of carbon (C), nickel (Ni), copper (Cu), silicon (Si), aluminum (Al), titanium (Ti), gallium nitride (GaN), gallium arsenide (GaAs), or silicon carbide (SiC).

A preparation method of the optoelectronic synaptic device may adopt magnetron sputtering, atomic layer deposition, electron beam deposition, electrochemical deposition, plasma chemical vapor deposition, chemical vapor deposition, electrochemical etching, and spray coating.

Additionally, the present invention provides an optoelectronic synaptic device array, comprising at least two optoelectronic synaptic memristors.

Additionally, the present invention provides a method for realizing an optoelectronic memristive effect with an optoelectronic synaptic memristor, comprising steps of:

step 1, a writing process: grounding a bottom electrode layer; injecting a weak infrared light which is sensitive to quantum dots but insensitive to a two-dimensional material through a ridge waveguide; converting the weak infrared light by the quantum dots to obtain a short-wavelength light to the two-dimensional material; applying a continuous forward voltage to a top electrode layer; wherein due to vacancy defect migration in the two-dimensional material, a conductive filament channel is formed; meanwhile, due to an optoelectronic effect of the short-wavelength light, a device resistance state is set to a low resistance state through optoelectronic synergy; and step 2, an erasing process: injecting a strong infrared light which is sensitive to the quantum dots but insensitive to the two-dimensional material through the ridge optical waveguide, and applying a continuous reverse voltage to the top electrode layer; wherein under an electric field, the conductive filament is broken due to the vacancy defects migrate inversely in the two-dimensional material; meanwhile, a strong photothermal effect of the strong infrared light exceeds an up-conversion optoelectronic effect, which inhibits a photocurrent and sets the device to a high resistance state; controlling quantities, pulse widths, periods, and amplitudes of electrical pulses to regulate multi-values among the low resistance state and the high resistance state, thereby obtaining multiple storage states and simulating corresponding synaptic functions, such as Spike-Timing Dependent Plasticity (STDP).

Compared with the prior art, the optoelectronic synaptic memristor of the present invention combines the precise light control of the top waveguide, so that the device has controllable optoelectronic signal transmission, and the array thereof has the potential to be prepared on large scale. The device has functional advantages as follows.

1. Compared with the conventional optoelectronic synaptic memristor, the porous structure modified with the quantum dots can directionally converting and emitting light with a wavelength sensitive to an active layer along with the porous array, and realizes confinement-controllable stimulation of the device by the up-conversion emitting, to overcome poor controllability of light excitation/inhibition in the optoelectronic synaptic device.
2. Under the optoelectronic field, based on the positive light/negative light effect and the optoelectronic/photothermal conversion mechanism, the EPSC/IPSC dynamic competition relationship of the synaptic device is regulated, and set and reset of the device are realized through excitation/inhibition of the optoelectronic synergy.
3. The transparent top electrode is combined with the waveguide to explore up-conversion directional emission and the optoelectronic/photothermal conversion mechanism together with the porous structure modified with the quantum dots, thereby realizing precise control of the light pulses as well as array integration of the optoelectronic synaptic device, and accelerating the application of the optoelectronic synaptic device in brain-like intelligence.

Element references: 101: ridge waveguide layer; 102: oxide isolation layer; 103: wedge-shaped output terminal; 104: grating coupler; 201: transparent top electrode layer; 202: top electrode input end; 301: two-dimensional material layer; 401: porous structure layer modified with quantum dots; and 501: bottom electrode layer.

DETAILED DESCRIPTION OF THE PREFERRED EMBODIMENT

The present invention is further illustrated in detail with the accompanying drawings and the preferred embodiments.

The preferred embodiments help to understand the present invention, and the specific structural details and functional details are only for describing the preferred embodiments, not for limiting. Therefore, the present invention can be implemented in various ways, and the present invention is not limited to the preferred embodiments, but encompassing all of the modifications, equivalents, and replacements within the scope of the present invention.

Preferred Embodiment 1

Figure 2:
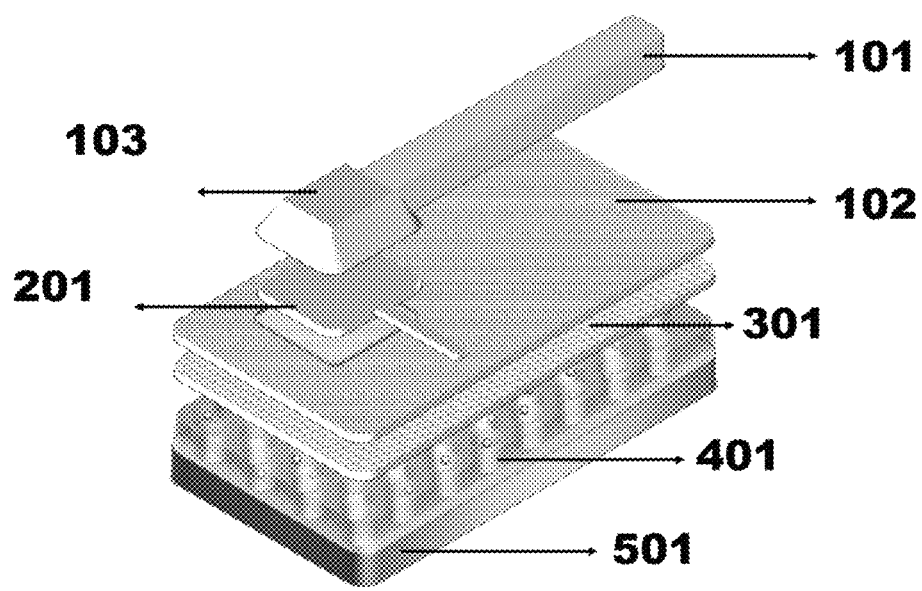
FIG. 2 is a structural sketch view of an optoelectronic synaptic memristor according to the preferred embodiment of the present invention.

According to the preferred embodiment 1 of the present invention, as shown in FIG. 2, an optoelectronic synaptic memristor is provided, comprising a silicon nitride waveguide layer ($Si_3N_4$) 101 with a wedge-shaped output terminal 103, an oxide isolation layer ($SiO_2$) 102, a transparent top electrode layer (ITO) 201, a two-dimensional material layer made of molybdenum disulfide and molybdenum oxide ($MoS_2/Mo_{2-x}O_x$) 301, a porous silicon oxide structure layer modified with graphene quantum dots ($GQDs@PSiO_x$) 401, and a bottom electrode layer (Si) 501, which are arranged in sequence from top to bottom.

The waveguide layer (without the wedge-shaped output terminal) has a width of 5 μm and a height of 10 μm; an inclination angle of each side of the wedge-shaped end is 45°, and a contact surface of the wedge-shaped output end with the transparent top electrode layer is 10*10 μm$^2$; the transparent top electrode layer has a thickness of 200 nm; the two-dimensional $MoS_2/Mo_{2-x}O_x$ layer, has a thickness of 10 nm; the porous structure layer has a thickness of 100 nm; and the bottom electrode layer has a thickness of 300 μm.

Figure 3:
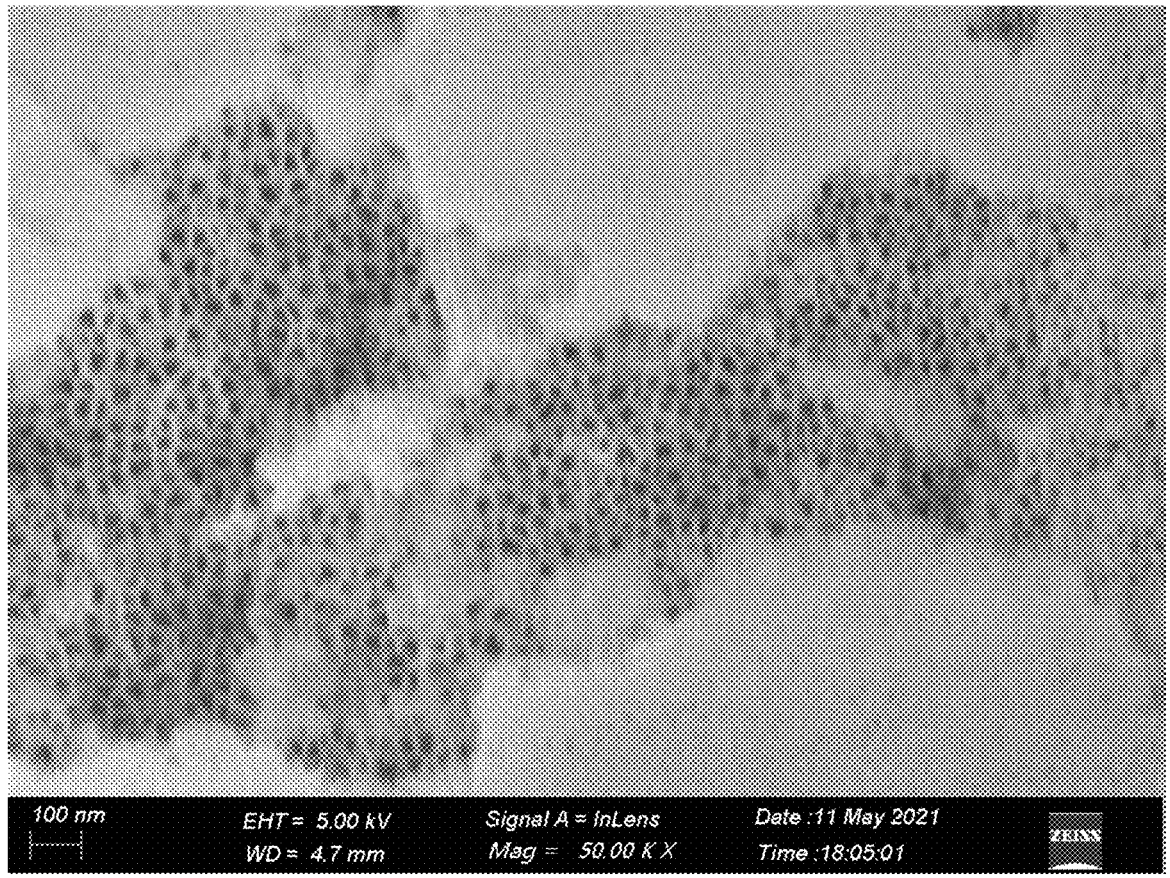
FIG. 3 is a scanning electron microscope (SEM) image of a porous silicon oxide structure according to the preferred embodiment of the present invention.
Figure 4:
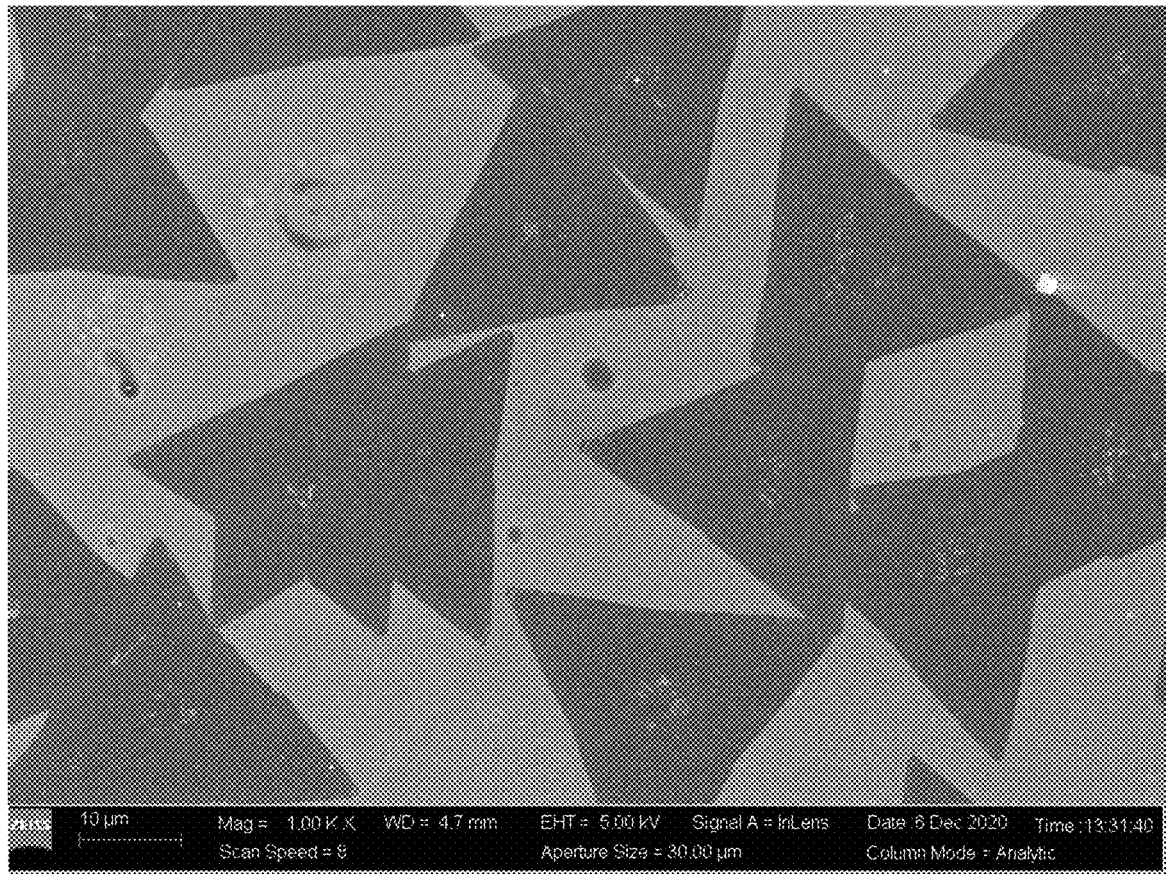
FIG. 4 is an SEM image of a two-dimensional $MoS_2/Mo_{2-x}O_x$ material on a Si substrate according to the preferred embodiment of the present invention.
Figure 5:
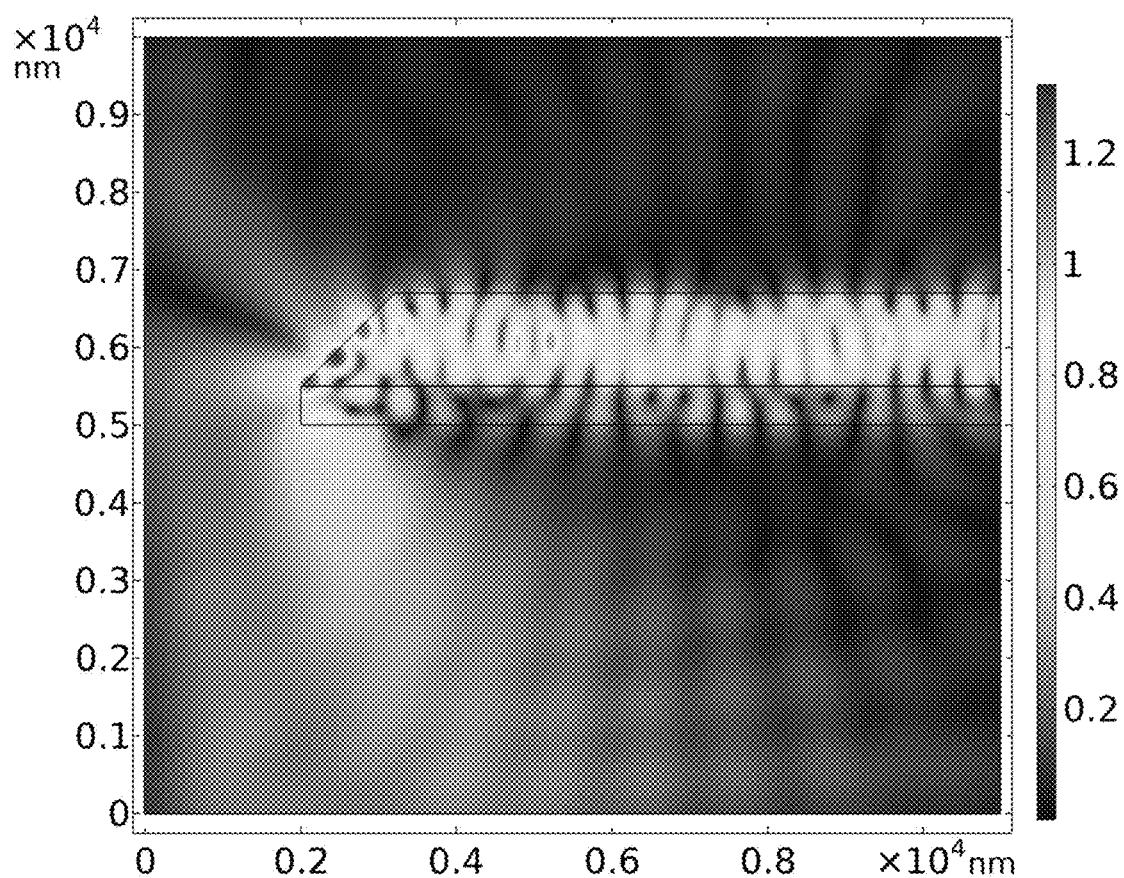
FIG. 5 is a simulated diagram of light field propagation in a waveguide with COMSOL software package according to the preferred embodiment of the present invention.

The optoelectronic synaptic memristor is prepared on a substrate layer by layer from bottom to top through electrochemical corrosion, ultrasonic dispersion, chemical vapor deposition, transferring, magnetron sputtering, lithography, and plasma vapor deposition. The specific preparation process comprises steps of:

(1) selecting highly-doped n-type (100) Si as the bottom electrode layer 501, and obtaining a porous silicon oxide structure layer through electrochemical corrosion, as shown in FIG. 3;

(2) placing the as-prepared porous silicon oxide structure layer into a graphene quantum dot dispersion solution, and obtaining the porous silicon oxide structure layer modified with the graphene quantum dots, namely a $GQDs@PSiO_x$ structure, through ultrasonic dispersion for 30 min;

(3) growing multi-layers nanosheet on a Si (100) substrate through chemical vapor deposition, and obtaining the two-dimensional $MoS_2/Mo_{2-x}O_x$ layer through oxidizing under an oxygen atmosphere with a vacuum tube furnace, as shown in FIG. 4;

(4) transferring the two-dimensional $MoS_2/Mo_{2-x}O_x$ layer onto the $GQDs@PSiO_x$ structure;

(5) obtaining the transparent ITO top electrode layer through lithography and magnetron sputtering;

(6) simulating and optimizing the performance of the waveguide structure with COMSOL software package, as shown in FIG. 5, and obtaining a suitable waveguide size, so that an infrared light of 980 nm can be vertically injected into an optoelectronic memristor structure; and (7) integrating the waveguide structure, namely the waveguide layer $Si_3N_4/SiO_2$, with the optoelectronic memristor structure through lithography and plasma vapor deposition, and obtaining the optoelectronic synaptic memristor.

Figure 6:
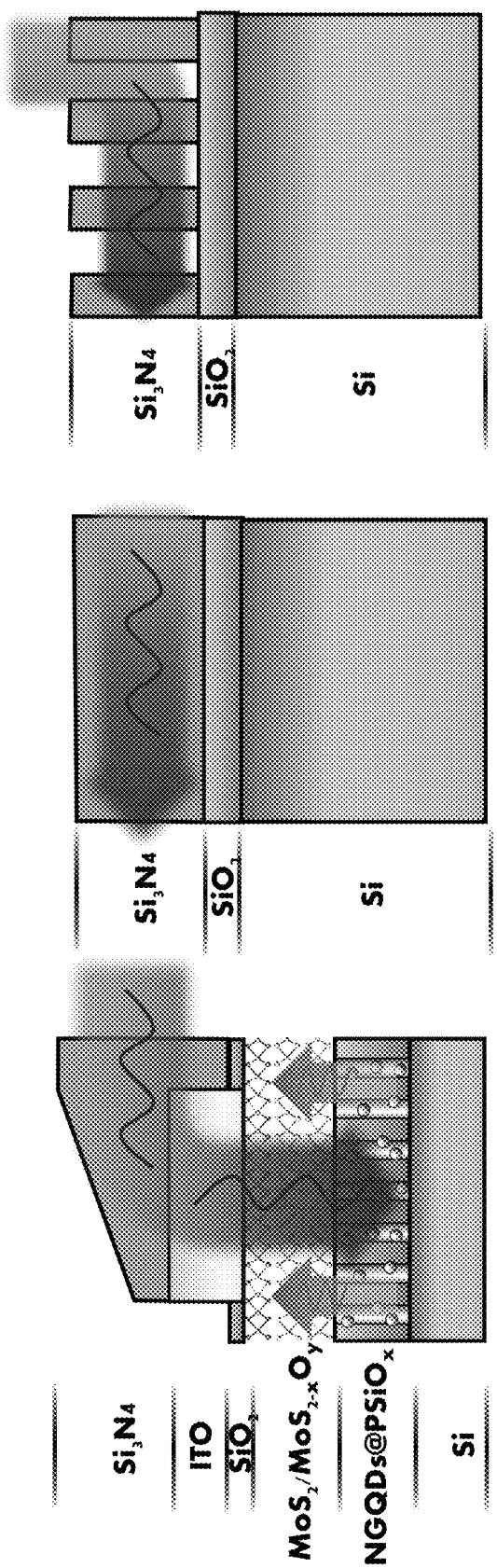
FIG. 6 is a mechanical diagram of the optoelectronic synaptic memristor according to the preferred embodiment of the present invention.

According to the preferred embodiment 1 of the present invention, through integrating the optical waveguide structure and the optoelectronic memristor structure, the optoelectronic synaptic memristor is obtained. As shown in FIG. 6, a writing process comprises steps of: injecting a 980 nm light by the device through the waveguide 101; then inwardly transmitting the light, in a direction perpendicular to the device, through the wedge-shaped output terminal 103, wherein the light passes through the transparent top electrode and the two-dimensional material layer to reach the up-conversion graphene quantum dots, and is converted into a blue-violet light about 400 nm before being transmitted to the $MoS_2/Mo_{2-x}O_x$ structure layer through the porous structure; at this time, an optoelectronic effect is far greater than a photothermal effect; and under stimulation of electric pulses, the device obtains a relatively fast and stable opening speed and current, and is set to a low resistance state.

An erasing process comprises steps of: injecting a strong 980 nm infrared light by the device through a waveguide, namely the waveguide layer 101; then inwardly transmitting the light, in the direction perpendicular to the device, through the wedge-shaped output terminal 103, wherein the light passes through the transparent top electrode and the two-dimensional material layer to reach the up-conversion graphene quantum dots; at this time, the photothermal effect is enhanced, and the optoelectronic effect induced by the blue-violet light of about 400 nm is weakened, so photocurrent generation of the $MoS_2/Mo_{2-x}O_x$ structure layer is inhibited; under stimulation of the electric pulses, the device obtains a relatively fast and stable closing speed and current, and is set to a high resistance state.

The device can control quantities, pulse widths, periods, and amplitudes of the electrical pulses to regulate values of the low resistance state and the high resistance state respectively, and simulating corresponding synaptic functions, such as Spike-Timing Dependent Plasticity.

The device has high alignment and confinement in light control, providing obvious advantages in device energy consumption and neural function simulation.

Preferred Embodiment 2

According to the preferred embodiment 2 of the present invention, as shown in FIG. 2, an optoelectronic synaptic memristor is provided, comprising a silicon waveguide layer (Si) 101 with a wedge-shaped output terminal 103, an oxide isolation layer ($SiO_2$) 102, a transparent top electrode layer (FTO) 201, a two-dimensional material layer made of black phosphorus (BP) 301, a silicon porous structure layer modified with $\beta$-$NaYF^4$:$Yb^{3+}$, $Tm^{3+}$/$NaYF^4$ quantum dots ($\beta$-$NaYF^4$:$Yb^{3+}$, $Tm^{3+}$/$NaYF^4$@PSi) 401, and a bottom electrode layer (Si) 501, which are arranged in sequence from top to bottom.

The waveguide has a width of 2.5 μm and a height of 5 μm; an inclination angle of each side of the wedge-shaped output end is 45°, and a contact surface of the wedge-shaped output terminal with the transparent top electrode layer is 5*5 μm$^2$; the transparent top electrode layer has a thickness of 100 nm; the two-dimensional material layer, namely a BP layer, has a thickness of 3 nm; the porous structure layer has a thickness of 150 nm; and the bottom electrode layer has a thickness of 500 μm.

The optoelectronic synaptic memristor is prepared on a substrate layer by layer from bottom to top through electrochemical corrosion, ultrasonic dispersion, chemical vapor deposition, transferring, magnetron sputtering, photoetching, and plasma vapor deposition. The specific preparation process is similar to that in the preferred embodiment 1.

According to the preferred embodiment 2 of the present invention, through integrating the waveguide and the optoelectronic memristor structure, the optoelectronic synaptic memristor is obtained. A writing process comprises steps of: injecting a low-power density 975 nm light by the device through the optical waveguide layer 101; then inwardly transmitting the light, in a direction perpendicular to the device, through the wedge-shaped output end 103, wherein the light passes through the transparent top electrode and the two-dimensional material to reach the up-conversion $NaYF^4$:$Yb^{3+}$, $Tm^{3+}$/$NaYF^4$ quantum dots, and is converted into an ultraviolet light around 280 nm and 365 nm before being transmitted to the BP structure layer through the porous structure; at this time, an optoelectronic effect (280 nm) is greater than a photothermal effect (365 nm); and under stimulation of electric pulses, the device obtains a relatively fast and stable opening speed and current, and is set to a low resistance state.

An erasing process comprises steps of: injecting a high-power density 975 nm light by the device through an optical waveguide, in such a manner that the photothermal effect (365 nm) is enhanced; at this time, photocurrent generation is inhibited; under stimulation of the electric pulses, the device obtains a relatively fast and stable closing speed and current, and is set to a high resistance state.

The device can control quantities, pulse widths, periods, and amplitudes of the electrical pulses to regulate values of the low resistance state and the high resistance state respectively, thereby obtaining multiple storage states and simulating corresponding synaptic functions, such as Spike-Timing Dependent Plasticity.

The device has high alignment and confinement in light control, providing obvious advantages in device energy consumption and neural function simulation.

Preferred Embodiment 3

Figure 1:
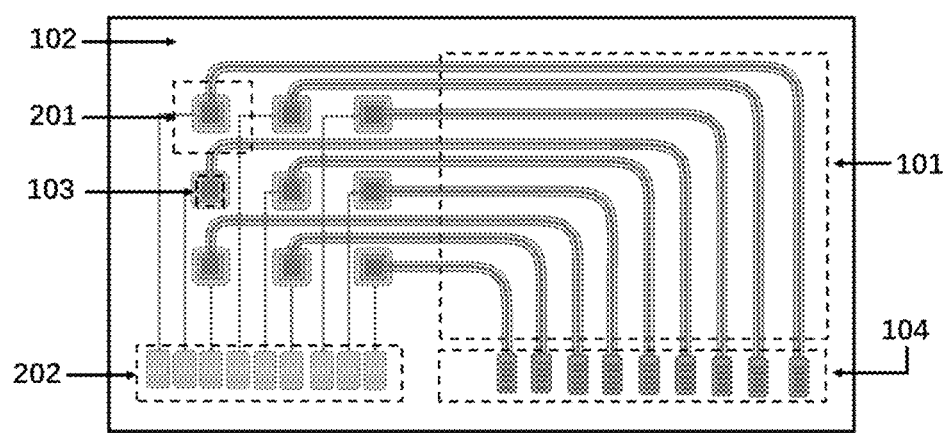
FIG. 1 is a structural sketch view of an optoelectronic synaptic memristor array according to a preferred embodiment of the present invention.

Referring to FIG. 1, the preferred embodiment 3 provides an optoelectronic synaptic device array, comprising: N*M optoelectronic synaptic memristors (N≥1 and M≥1). Each of the optoelectronic synaptic memristors comprises: a silicon nitride waveguide layer ($Si_3N_4$) 101 with a wedge-shaped output terminal ($Si_3N_4$) 103, an oxide isolation layer ($SiO_2$) 102, a grating coupler ($Si_3N_4$) 104, a transparent top electrode layer (ITO) 201, an external electrode (Au) 202 connected to the top electrode, a two-dimensional material layer ($MoS_2/Mo_{2-x}O_x$) 301 located below an oxide isolation layer, which is made of molybdenum disulfide and molybdenum oxide, a porous silicon oxide structure layer modified with graphene quantum dots (GQDs@$PSiO_x$) 401, and a bottom electrode layer (Si) 501.

According to the preferred embodiment 3, the optoelectronic synaptic device array is obtained by integrating the waveguides and the optoelectronic memristors structure. All the optoelectronic synaptic memristors share one bottom electrode, but electrical signals of the optoelectronic synaptic memristors are individually controlled through independent top electrodes; each of the optoelectronic synaptic memristors has an independent waveguide system, and light of different intensities and wavelengths are input through different grating couplers; through each waveguide, the light is accurately injected into each of the optoelectronic synaptic memristors. Therefore, the functions of the optoelectronic synaptic memristors are separately regulated.

Specific operation processes and mechanisms of the optoelectronic synaptic memristor array are as follows. In a writing process, the writing and erasing of a single device in the array are similar to those of an independent device.

By combining the functions of multiple memristors, the array can simulate the corresponding synaptic functions to realize applications such as logic operations, matrix operations, image recognition, and neuromorphic calculations.

It should be noted that, in each embodiment of the present invention, to enable readers to better understand the present invention and to make it understandable by those of ordinary skill in the art, many technical details are proposed. However, the technical solution of the present invention can be realized without these technical details, or with various changes and modifications based on the preferred embodiments.

What is claimed is:

1. An optoelectronic synaptic memristor, comprising: a bottom electrode layer, a porous structure layer modified with quantum dots, a two-dimensional material layer, a transparent top electrode layer, and a waveguide layer, which are arranged in sequence from top to bottom, wherein: a bottom of the two-dimensional material layer is attached on the porous structure layer modified with the quantum dots; and a top of the two-dimensional material layer is connected to the transparent top electrode layer;

the waveguide layer is a ridge waveguide for light conduction, comprising a wedge-shaped output terminal, wherein: through the wedge-shaped output end of the waveguide layer, light is vertically injected into the two-dimensional material layer and the porous structure layer modified with the quantum dots;

wherein the wedge-shaped output terminal has four inclined walls, wherein an inclination angle of each wall is 30-60°.

2. The optoelectronic synaptic memristor, as recited in claim 1, further comprising: an oxide isolation layer which is arranged between the two-dimensional material layer and the waveguide layer, wherein: a refractive index of the oxide isolation layer is less than a refractive index of the waveguide layer; a hole, whose shape is consistent with the transparent top electrode layer, is provided on the oxide isolation layer, for placing the transparent top electrode layer.

3. The optoelectronic synaptic memristor, as recited in claim 1, wherein the porous structure layer modified with the quantum dots serves as an up-conversion light emitter and a light channel, wherein: the quantum dots serve as an up-conversion center and are attached in the porous structure layer; the porous structure layer is a vertical porous array for remitting incident light of the transparent top electrode layer into the two-dimensional material layer after up-conversion.

4. The optoelectronic synaptic memristor, as recited in claim 3, wherein the quantum dots are made of a material having an up-conversion function, wherein the material is one of cadmium telluride (CdTe), cadmium selenide (CdSe), indium phosphide (InP), zinc sulfide (ZnS), cadmium sulfide (CdS), graphene, graphene oxide, reduced graphene oxide, and $NaYF^4$.

5. The optoelectronic synaptic memristor, as recited in claim 3, wherein the porous structure layer is a porous array that is vertically arranged and made of silicon oxide ($SiO_2$), silicon (Si), aluminum oxide ($Al_2O_3$), copper oxide (CuO), nickel oxide (NiO), titanium dioxide ($TiO_2$), or tungsten trioxide ($WO_3$).

6. A method for realizing an optoelectronic memristive effect with an optoelectronic synaptic memristor, comprising steps of:

a writing process: grounding a bottom electrode layer; injecting a weak infrared light which is sensitive to quantum dots but insensitive to a two-dimensional material through a ridge waveguide; converting the weak infrared light by the quantum dots to obtain a short-wavelength light to the two-dimensional material; applying a continuous forward voltage to a top electrode layer; wherein due to vacancy defect migration in the two-dimensional material, a conductive filament is formed; meanwhile, due to an optoelectronic effect of the short-wavelength light, a device resistance state is set to a low resistance state through optoelectronic synergy;

an erasing process: injecting a strong infrared light which is sensitive to the quantum dots but insensitive to the two-dimensional material through the ridge waveguide, and applying a continuous reverse voltage to the top electrode layer; wherein under an electric field, the conductive filament is broken due to the vacancy defects migrate inversely in the two-dimensional material; meanwhile, a strong photothermal effect of the strong infrared light exceeds an up-conversion optoelectronic effect, which inhibits a photocurrent and sets the device resistance state to a high resistance state; and controlling quantities, pulse widths, periods, and amplitudes of electrical pulses to regulate multi-values among the low resistance state and the high resistance state, thereby obtaining multiple storage states and simulating corresponding synaptic functions.

\* \* \* \* \*